(12) United States Patent
Wu et al.

(10) Patent No.: US 10,714,410 B1
(45) Date of Patent: Jul. 14, 2020

(54) SEMICONDUCTOR STRUCTURE

(71) Applicant: Vanguard International Semiconductor Corporation, Hsinchu (TW)

(72) Inventors: Cheng-Tsung Wu, Taipei (TW); Shin-Cheng Lin, Tainan (TW); Hsiao-Ling Chiang, Hsinchu (TW); Wen-Hsin Lin, Jhubei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/247,867

(22) Filed: Jan. 15, 2019

(51) Int. Cl.
*H01L 23/48* (2006.01)
*H01L 29/06* (2006.01)
*H01L 29/78* (2006.01)
*H01L 23/532* (2006.01)

(52) U.S. Cl.
CPC ...... *H01L 23/481* (2013.01); *H01L 23/53209* (2013.01); *H01L 29/0649* (2013.01); *H01L 29/7817* (2013.01)

(58) Field of Classification Search
CPC ............. H01L 29/1095; H01L 29/1608; H01L 29/7397; H01L 29/53209; H01L 23/481
See application file for complete search history.

(56) References Cited

U.S. PATENT DOCUMENTS

| 5,416,356 | A * | 5/1995 | Staudinger | H01L 27/08 257/531 |
| 6,885,275 | B1 | 4/2005 | Chang | |
| 6,909,143 | B2 * | 6/2005 | Jeon | H01L 29/0634 257/335 |
| 9,257,533 | B2 | 2/2016 | Huo et al. | |
| 2002/0153556 | A1 * | 10/2002 | Rumennik | H01L 29/0619 257/325 |
| 2008/0042236 | A1 | 2/2008 | Seah | |
| 2008/0265319 | A1 * | 10/2008 | Eggenkamp | H01L 21/26513 257/336 |
| 2017/0125582 | A1 | 5/2017 | Murukesan et al. | |

FOREIGN PATENT DOCUMENTS

CN  105280612 A  1/2016

OTHER PUBLICATIONS

Taiwan Office Action for application No. 106118070 dated Nov. 8, 2017.
Taiwan Office Action for application No. 107120162 dated Oct. 26, 2018.
Taiwanese Office Action and Search Report dated Feb. 20, 2019 for Application No. 107120162.

* cited by examiner

*Primary Examiner* — Zandra V Smith
*Assistant Examiner* — John M Parker
(74) *Attorney, Agent, or Firm* — Birch, Stewart, Kolasch & Birch, LLP

(57) ABSTRACT

A semiconductor structure including a substrate, a first well, a field oxide layer, a first conductive line and a second conductive line is provided. The substrate has a first conductivity type. The first well is formed on the substrate and has a second conductivity type. The field oxide layer is disposed on the first well. The first conductive line is formed on the field oxide layer and is in direct contact with the field oxide layer. The second conductive line is formed on the field oxide layer and is in direct contact with the field oxide layer. The first conductive line is spaced apart from the second conductive line.

19 Claims, 10 Drawing Sheets

SEMICONDUCTOR STRUCTURE

BACKGROUND OF THE INVENTION

Field of the Invention

The invention relates to a semiconductor structure.

Description of the Related Art

Generally, integrated circuits comprise many electronic elements. These electronic elements can be classified into two groups: active elements and passive elements. The active elements comprise transistors. Additionally, the passive elements comprise resistors, capacitors and inductors. A conventional integrated circuit utilizes metal wires to connect many independent electronic elements. However, this increases the size of the integrated circuit. Additionally, a conducting wire is utilized to connect two elements during the packaging process, raising the cost of the integrated circuit.

BRIEF SUMMARY OF THE INVENTION

In accordance with an embodiment, a semiconductor structure comprises a substrate, a first well, a field oxide layer, a first conductive line and a second conductive line. The substrate has a first conductivity type. The first well is formed on the substrate and has a second conductivity type. The field oxide layer is disposed on the first well. The first conductive line is formed on the field oxide layer and is in direct contact with the field oxide layer. The second conductive line is formed on the field oxide layer and is in direct contact with the field oxide layer. The first conductive line is spaced apart from the second conductive line.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
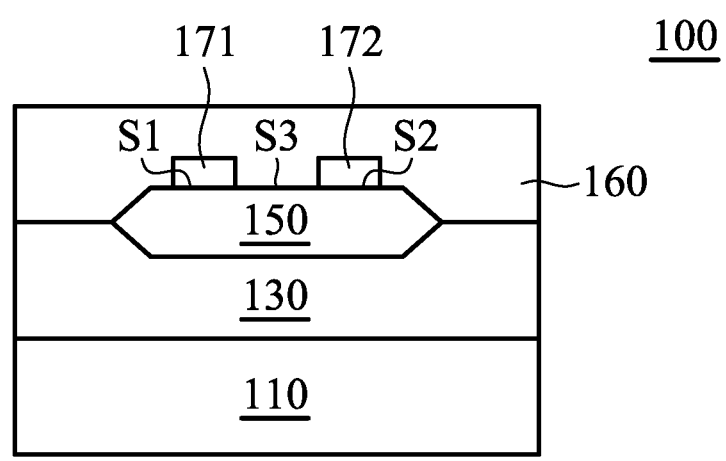
FIG. 1 is a schematic diagram of an exemplary embodiment of a semiconductor structure, according to various aspects of the present disclosure.

The semiconductor structure of the present disclosure and methods for manufacturing a semiconductor structure are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the like and/or corresponding numerals in the drawings of different embodiments do not suggest any correlation between different embodiments. In addition, in this specification, expressions such as "a first material layer disposed on/over a second material layer", may indicate not only the direct contact of the first material layer and the second material layer, but also, a non-contact state with one or more intermediate layers between the first material layer and the second material layer. In the above situation, the first material layer may not be in direct contact with the second material layer.

FIG. 1 is a schematic diagram of an exemplary embodiment of a semiconductor structure, according to various aspects of the present disclosure. The semiconductor structure 100 comprises a substrate 110, a well 130, a field oxide layer 150, an insulating layer 160 and conductive lines 171 and 172. The substrate 110 has a first conductivity type. In one embodiment, the substrate 110, such as a silicon substrate, a silicon on insulator (SOI) substrate or another suitable semiconductor substrate, is provided.

The well 130 is formed in the substrate 110 and has a second conductivity type. In some embodiments, the well 130 is formed by ion implantation. For example, when the second conductivity type is N-type, the predetermined region for the well 130 may be implanted with phosphorous ions or arsenic ions to form the well 130. However, when the second conductivity type is P-type, the predetermined region for the well 130 may be implanted with boron ions or indium ions to form the well 130. In one embodiment, the well 130 is a high-voltage well. In another embodiment, the second conductivity type is different from the first conductivity type. For example, when the first conductivity type is P-type, the second conductivity type is N-type. However, when the first conductivity type is N-type, the second conductivity type is P-type. In other embodiments, the first conductivity type is the same as the second conductivity type. In such cases, the dopant concentration of the well 130 is higher than the dopant concentration of the substrate 110.

The field oxide layer 150 is disposed on the well 130. In this embodiment, the field oxide layer 150 is extended into the well 130. In one embodiment, the field oxide layer 150 is a rectangle structure and extended along a straight path. In another embodiment, the field oxide layer 150 is a ring-shaped structure.

The conductive lines 171 and 172 are formed on the field oxide layer 150. As shown in FIG. 1, the conductive lines 171 and 172 are in direct contact with the field oxide layer 150. The material of each of the conductive lines 171 and 172 is SiCr, metal or Poly. In this embodiment, the conductive line 171 is spaced apart from the conductive line 172. As shown in FIG. 1, the bottom surface S1 of the conductive line 171 and the bottom surface S2 of the conductive line 172 are in direct contact with the top surface S3 of the field oxide layer 150. In one embodiment, the conductive line 171 does not overlap the conductive line 172. In this embodiment, the conductive line 171 is used as one passive element and the conductive line 172 is used as another passive element. The shapes of the conductive lines 171 and 172 are not limited in this disclosure. The shape of the conductive line 171 may be the same as or different from the shape of the conductive line 172. In one embodiment, the conductive line 171 is provided as an inductor element. In such cases, the conductive line 171 is extended along a helical-shaped path.

Furthermore, the length of each of the conductive lines 171 and 172 is not limited in the disclosure. The length of the conductive line 171 may be the same as or different from the length of the conductive line 172. In other embodiments, the width of the conductive line 171 may be the same as or different from the width of the conductive line 172. In some embodiments, at least one of the conductive lines 171 and 172 is provided as a resistor element. In such cases, the length or width of the conductive line is controlled to adjust the resistance of the conductive line. In other embodiments, at least one of the conductive lines 171 and 172 is used as an inductor element. In such cases, the length or width of the conductive line is controlled to adjust the inductance of the conductive line. The number of conductive lines is not limited in the present disclosure. In some embodiments, the semiconductor structure 100 comprises more conductive lines. In such cases, each conductive line is in direct contact with the field oxide layer 150, and the conductive lines are spaced apart from each other.

The insulating layer 160 is formed on the well 130, the field oxide layer 150, the conductive lines 171 and 172 and electrically isolated from the conductive lines 171 and 172. The material of the insulating layer 160 may include oxide, nitride, oxynitride, low-k material, any other suitable insulation material, or a combination thereof. The insulating layer 160 may be formed by chemical vapor deposition (CVD).

Figure 2:
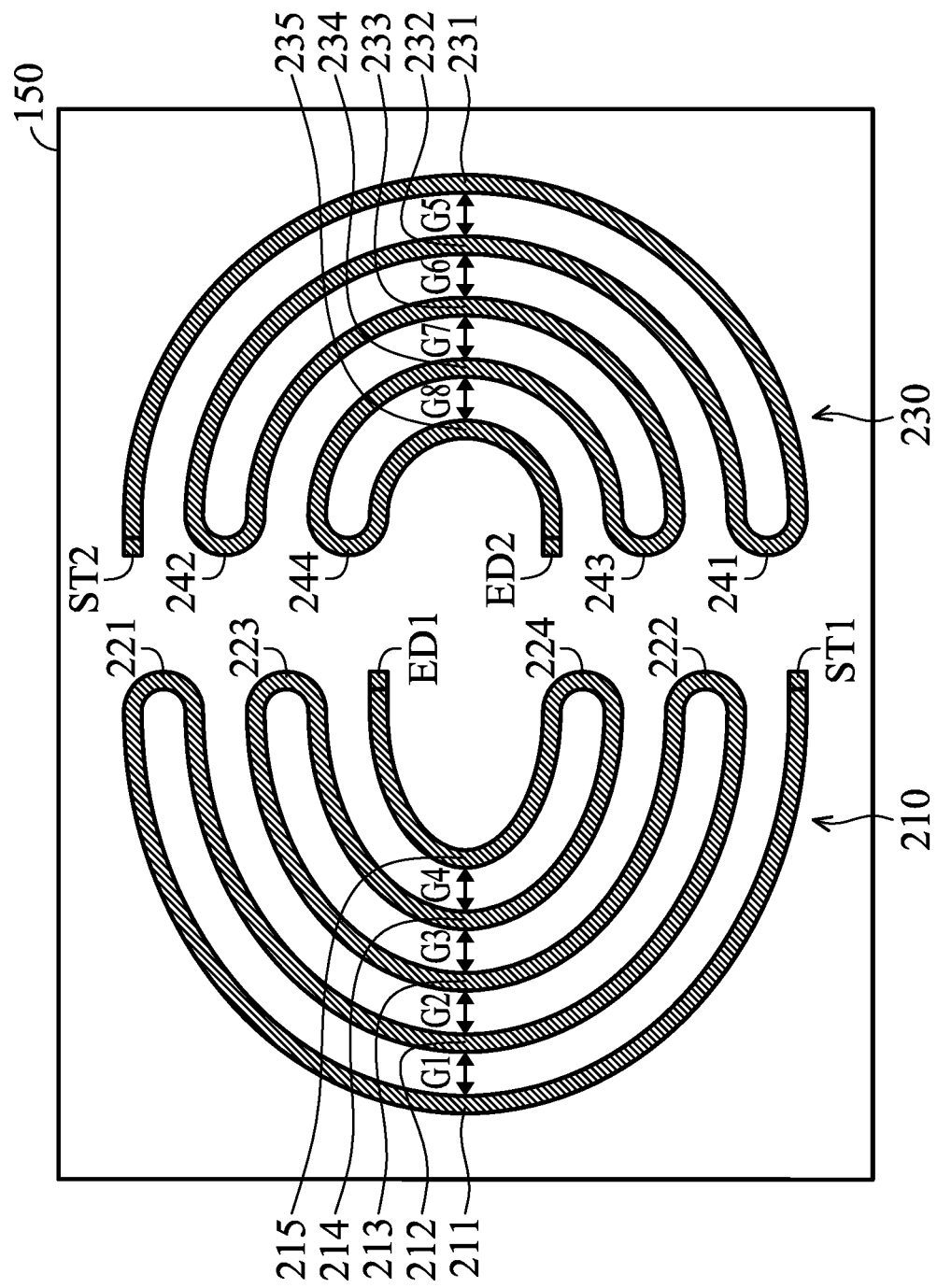
FIG. 2 is a plan view of an exemplary embodiment of a field oxide layer and a conductive line.

FIG. 2 is a plan view of exemplary embodiments of a field oxide layer and a conductive line. In FIG. 2, the field oxide layer 150 is extended along a rectangular path. In this embodiment, beginning at a start terminal ST1, the conductive line 210 is extended along a curved-shaped path and finally to an end terminal ED1. As shown in FIG. 2, the conductive line 210 is constituted by curved portions 211~215 and connection portions 221~224. The shapes of the curved portions 211~215 of the conductive line 210 are the same. In this embodiment, the curved portions 211~215 of the conductive line 210 are U-shaped portions, but the disclosure is not limited thereto. Additionally, the number of curved portions of the conductive line 210 is not limited in the disclosure. In some embodiments, the conductive line 210 may comprise more curved portions or fewer portions.

As shown in FIG. 2, a pitch G1 exists between the curved portions 211 and 212. A pitch G2 exists between the curved portions 212 and 213. A pitch G3 exists between the curved portions 213 and 214. A pitch G4 exists between the curved portions 214 and 215. In this embodiment, the widths of the pitches G1~G4 are the same, but the disclosure is not limited thereto. In other embodiments, the width of at least one of the pitches G1~G4 is not equal to the width of another of the pitches G1~G4.

The connection portion 221 is connected between the curved portions 211 and 212. The connection portion 222 is connected between the curved portions 212 and 213. The connection portion 223 is connected between the curved portions 213 and 214. The connection portion 224 is connected between the curved portions 214 and 215. The invention does not limit the shapes of the connection portions 221~224. In one embodiment, each of the connection portions 221~224 is extended along a strip-shaped path or a curved-shaped path. Each of the connection portions 221~224 is a strip-shaped structure or a curved-shaped structure. In other embodiments, the shape of one of the connection portions 221~224 may be the same as or different from the shape of another of the connection portions 221~224.

Similarly, beginning at a start terminal ST2, the conductive line 230 is extended along a curved-shaped path and finally to an end terminal ED2. As shown in FIG. 2, the conductive line 230 is constituted by curved portions 231~235 and connection portions 241~244. The shapes of the curved portions 231~235 of the conductive line 230 are the same. In this embodiment, the curved portions 231~235 of the conductive line 230 are U-shaped portions, but the disclosure is not limited thereto. In other embodiments, the shapes of the curved portions 231~235 may be different from the shapes of the curved portions 211~215. Additionally, the number of curved portions of the conductive line 230 is not limited in the disclosure. In some embodiments, the conductive line 230 may comprise more curved portions or fewer portions.

A pitch G5 exists between the curved portions 231 and 232. A pitch G6 exists between the curved portions 232 and 233. A pitch G7 exists between the curved portions 233 and 244. A pitch G8 exists between the curved portions 234 and 235. In this embodiment, the widths of the pitches G5~G8 are the same, but the disclosure is not limited thereto. In other embodiments, the width of at least one of the pitches G5~G8 is not equal to the width of another of the pitches G5~G8. In some embodiments, the width of at least one of the pitches G5~G8 is equal to the width of another of the pitches G5~G8.

The connection portion 241 is connected between the curved portions 231 and 232. The connection portion 242 is connected between the curved portions 232 and 233. The connection portion 243 is connected between the curved portions 233 and 234. The connection portion 244 is connected between the curved portions 234 and 235. The invention does not limit the shapes of the connection portions 241~244. In one embodiment, each of the connection portions 241~244 is extended along a strip-shaped path or a curved-shaped path. Each of the connection portions 241~244 is a strip-shaped structure or a curved-shaped structure. In other embodiments, the shape of one of the connection portions 241~244 may be the same as or different from the shape of another of the connection portions 241~244.

In this embodiment, the number of curved portion of the conductive line 210 is the same as the number of curved portion of the conductive line 230, but the disclosure is not limited thereto. In other embodiments, the number of curved portion of the conductive line 210 may be more than or less than the number of curved portion of the conductive line 230. In some embodiments, the lengths and widths of the conductive lines 210 and 230 are controlled to adjust the resistances of the conductive lines 210 and 230. In one embodiment, the resistance of the conductive line 210 is the same as or different from the resistance of the conductive line 230. In this embodiment, the length of the conductive line 210 is longer than the length of the conductive line 230. Therefore, the resistance of the conductive line 210 is higher than the resistance of the conductive line 230. In one embodiment, the resistances of the conductive lines 210 and 230 are between 1MΩ·770 MΩ.

Figure 3A:
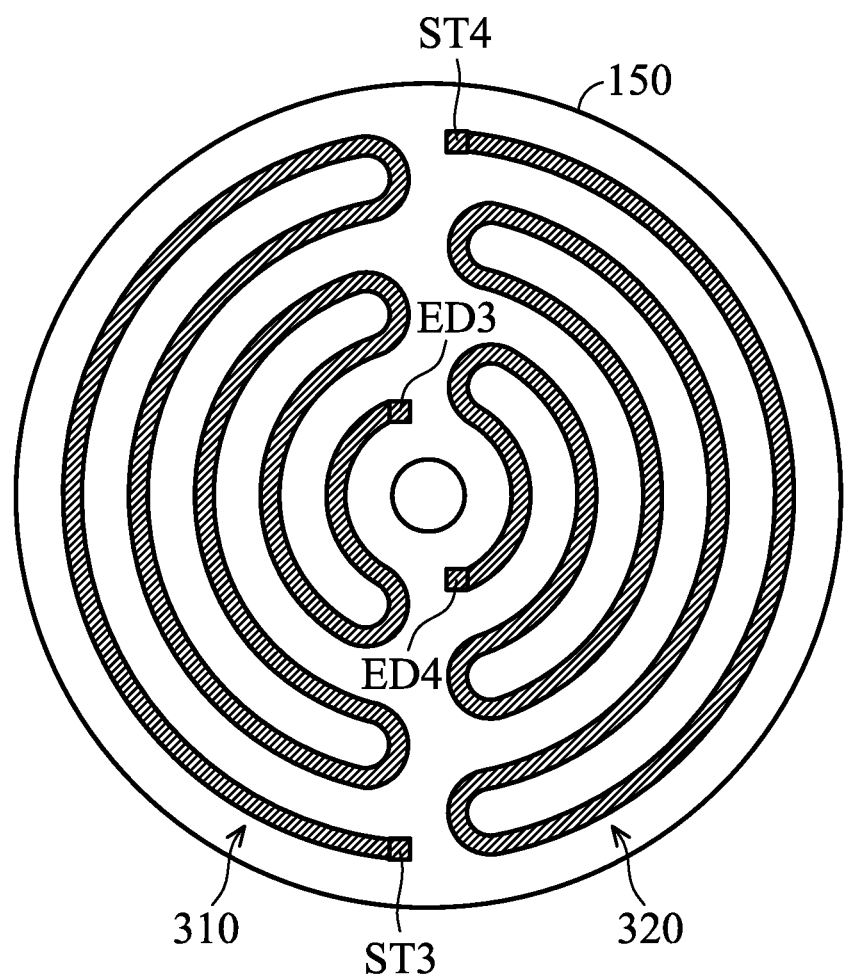
FIG. 3A is a plan view of another exemplary embodiment of the field oxide layer and the conductive line according to various aspects of the present disclosure.

FIG. 3A is a plan view of another exemplary embodiment of the field oxide layer and the conductive line according to various aspects of the present disclosure. In this embodiment, the extended path of the field oxide layer 150 is a ring-shape path. The conductive lines 310 and 320 are formed on the field oxide layer 150 and are in direct contact with the field oxide layer 150. As shown in FIG. 3A, beginning at a start terminal ST3, the conductive line 310 is extended along a curved-shaped path and finally to an end terminal ED3. Beginning at a start terminal ST4, the conductive line 320 is extended along a curved-shaped path and finally to an end terminal ED4. In FIG. 3A, the conductive line 310 is spaced apart from the conductive line 320. The lengths of the conductive lines 310 and 320 are not limited in the present disclosure. In this embodiment, the length and the width of the conductive line 310 are the same as the length and the width of the conductive line 320. Therefore, the resistance of the conductive line 310 is the same as the resistance of the conductive line 320. Additionally, the layout pattern of the conductive line 310 is similar to the layout pattern of the conductive line 320.

Figure 3B:
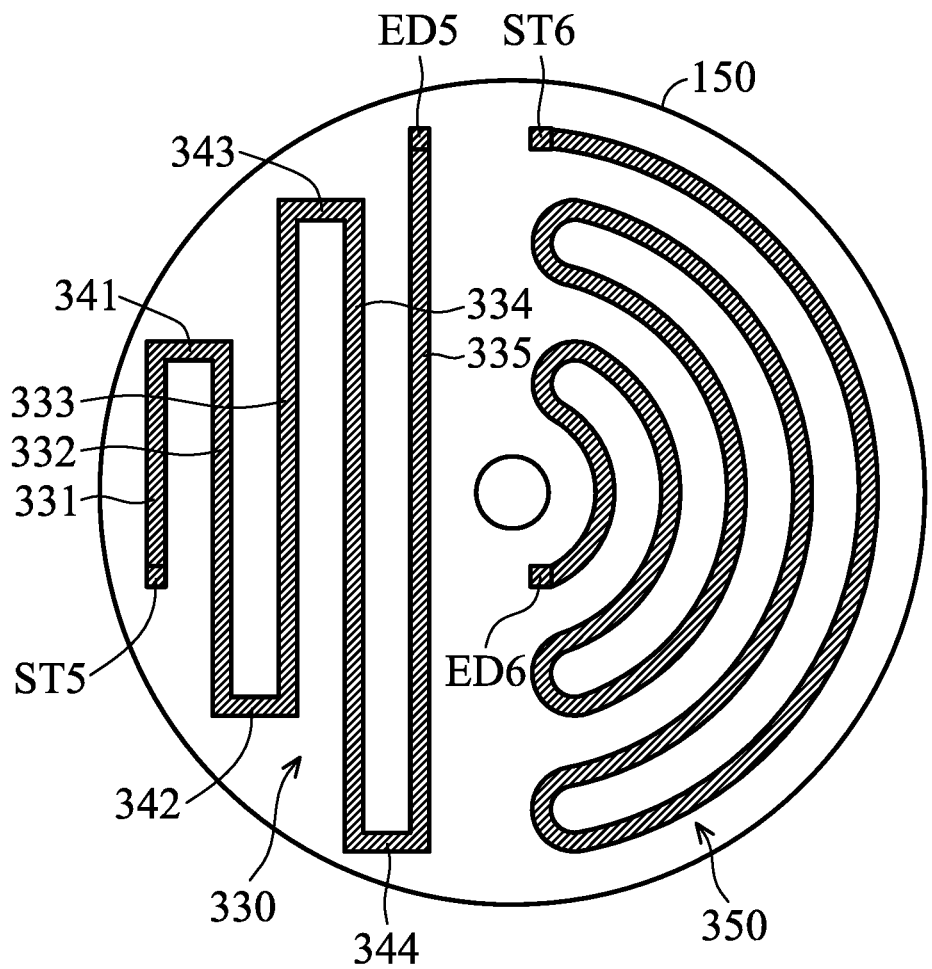
FIG. 3B is a plan view of another exemplary embodiment of the field oxide layer and the conductive line according to various aspects of the present disclosure.

FIG. 3B is a plan view of another exemplary embodiment of the field oxide layer and the conductive line according to various aspects of the present disclosure. FIG. 3B is similar to FIG. 3A exception that the shape of the conductive line 330 is different from the shape of the conductive line 350. In this embodiment, beginning at a start terminal ST5, the conductive line 330 is extended along a saw-tooth-shaped path and finally to an end terminal ED5. Beginning at a start terminal ST6, the conductive line 250 is extended along a curved-shaped path and finally to an end terminal ED6.

The conductive line 330 is constituted by the strip-shaped portions 331~335 and connection portions 341~344. The lengths of the strip-shaped portions 331~335 are different, but the disclosure is not limited thereto. In other embodiments, the length of at least one of the strip-shaped portions 331~335 is the same as the length of another of the strip-shaped portions 331~335.

The connection portion 341 is connected between the strip-shaped portions 331 and 332. The connection portion 342 is connected between the strip-shaped portions 332 and 333. The connection portion 343 is connected between the strip-shaped portions 333 and 334. The connection portion 344 is connected between the strip-shaped portions 334 and 335. In this embodiment, the extended paths of the connection portions 341~344 are strip-shaped paths, but the disclosure is not limited thereto. In other embodiments, the shape of the extended path of at least one of the connection portions 341~344 may be different from the shape of the extended path of another of the connection portions 341~344. In one embodiment, each of the connection portions 341~344 is a C-shaped portion or a U-shaped portion. Since the extended path of the conductive line 350 is similar to the extended path of the conductive line 320 shown in FIG. 3A, the description of the conductive line 350 is omitted. In this embodiment, the conductive line 330 is spaced apart from the conductive line 350.

Figure 4A:
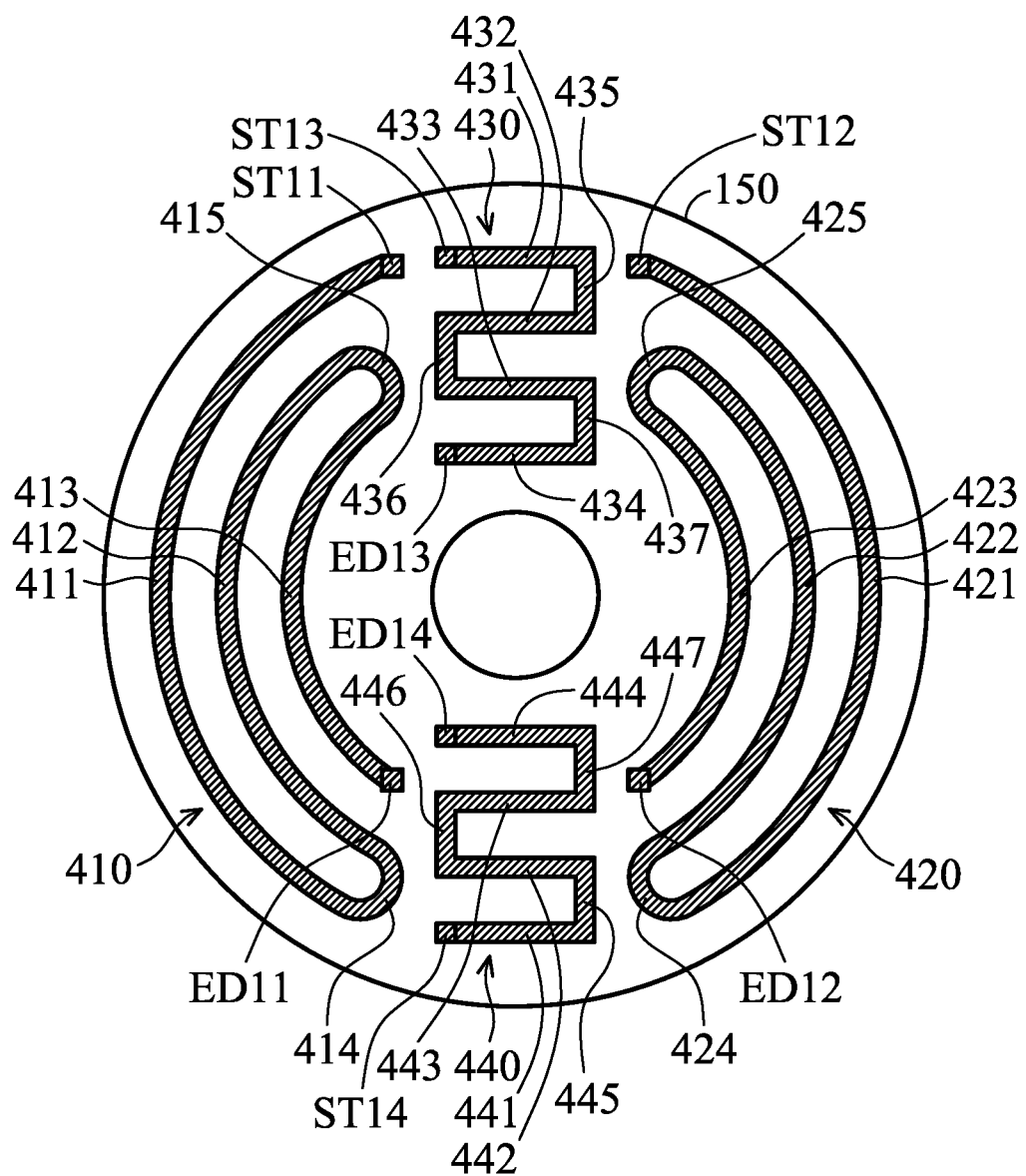
FIG. 4A is a plan view of another exemplary embodiment of the field oxide layer and the conductive line according to various aspects of the present disclosure.

FIG. 4A is a plan view of another exemplary embodiment of the field oxide layer and the conductive line according to various aspects of the present disclosure. In this embodiment, the conductive lines 410, 420, 430 and 440 are formed on the field oxide layer 150. The bottoms of the conductive lines 410, 420, 430 and 440 are in direct contact with the top surface of the field oxide layer 150. As shown in FIG. 4A, the conductive lines 410, 420, 430 and 440 are spaced apart from each other. Furthermore, the conductive lines 410, 420, 430 and 440 are not overlapped from each other.

In this embodiment, beginning at a start terminal ST11, the conductive line 410 is extended along a curved-shaped path and finally to an end terminal ED11. The conductive line 410 comprises curved portions 411~413 and connection portions 414 and 415. The connection portion 414 is connected between the curved portions 411 and 412. The connection portion 415 is connected between the curved portions 412 and 413.

Beginning at a start terminal ST12, the conductive line 420 is extended along a curved-shaped path and finally to an end terminal ED12. The conductive line 420 comprises curved portions 421~423 and connection portions 424 and 425. The connection portion 424 is connected between the curved portions 421 and 422. The connection portion 425 is connected between the curved portions 422 and 423.

Beginning at a start terminal ST13, the conductive line 430 is extended along a strip-shaped path and finally to an end terminal ED13. The conductive line 430 comprises strip-shaped portions 431~434 and connection portions 435~437. The connection portion 435 is connected between the strip-shaped portions 431 and 432. The connection portion 436 is connected between the strip-shaped portions 432 and 433. The connection portion 437 is connected between the strip-shaped portion 433 and 434. In one embodiment, the lengths of the strip-shaped portions 431~434 are the same, but the disclosure is not limited thereto. In other embodiments, the length of at least one of the strip-shaped portions 431~434 is different from the length of another of the strip-shaped portions 431~434.

Beginning at a start terminal ST14, the conductive line 440 is extended along a strip-shaped path and finally to an end terminal ED14. The conductive line 440 comprises strip-shaped portions 441~444 and connection portions 445~447. The connection portion 445 is connected between the strip-shaped portions 441 and 442. The connection portion 446 is connected between the strip-shaped portions 442 and 443. The connection portion 447 is connected between the strip-shaped portions 443 and 444. In one embodiment, the lengths of the strip-shaped portions 441~444 are the same, but the disclosure is not limited thereto. In other embodiments, the length of at least one of the strip-shaped portions 441~444 is different from the length of another of the strip-shaped portions 441~444.

In this embodiment, the shape of the extended path of the conductive line 410 is the same as the shape of the extended path of the conductive line 420, and the shape of the extended path of the conductive line 430 is the same as the shape of the extended path of the conductive line 440. However, the shape of the extended path of the conductive line 410 is different from the shape of the extended path of the conductive line 430. In other embodiments, the shape of the extended path of at least one of the conductive lines 410, 420, 430 and 440 is different from the shape of the extended path of another of the conductive lines 410, 420, 430 and 440. The resistances of the conductive lines 410, 420, 430 and 440 are capable of being adjusted according to the lengths and widths of the conductive lines 410, 420, 430 and 440. Therefore, the conductive lines 410, 420, 430 and 440 may be equivalent to four resistor elements.

Figure 4B:
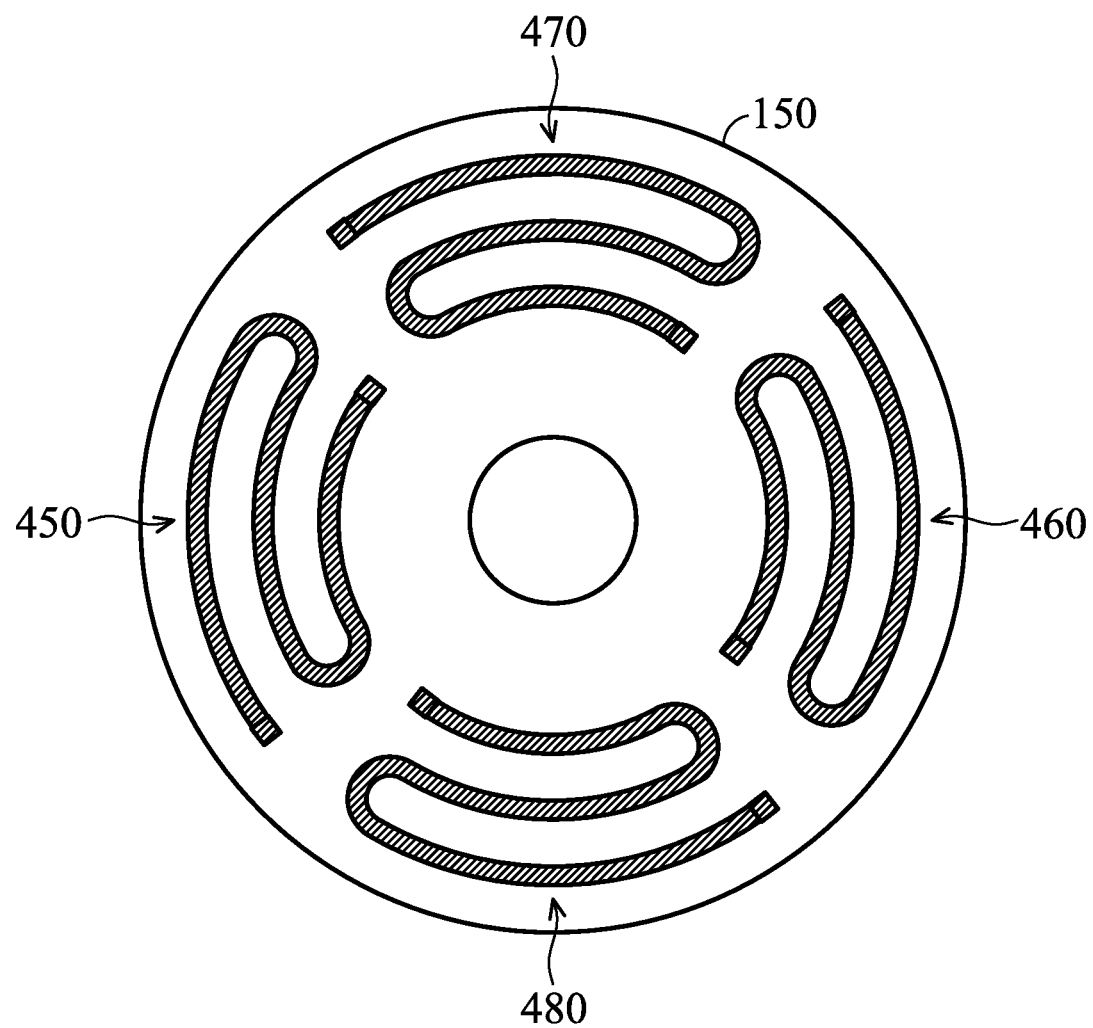
FIG. 4B is a plan view of another exemplary embodiment of the field oxide layer and the conductive line according to various aspects of the present disclosure.

FIG. 4B is a plan view of another exemplary embodiment of the field oxide layer and the conductive line according to various aspects of the present disclosure. In this embodiment, the shape of the extended path of the conductive lines 450, 460, 470 and 480 are the same. As shown in FIG. 4B, each of the conductive lines 450, 460, 470 and 480 comprises a plurality of curved portions, but the disclosure is not limited thereto. In other embodiments, at least one of the conductive lines 450, 460, 470 and 480 comprises a single curved portion. In some embodiments, the conductive line 330 shown in FIG. 3B is capable of replacing at least one of the conductive lines 450, 460, 470 and 480.

Figure 5:
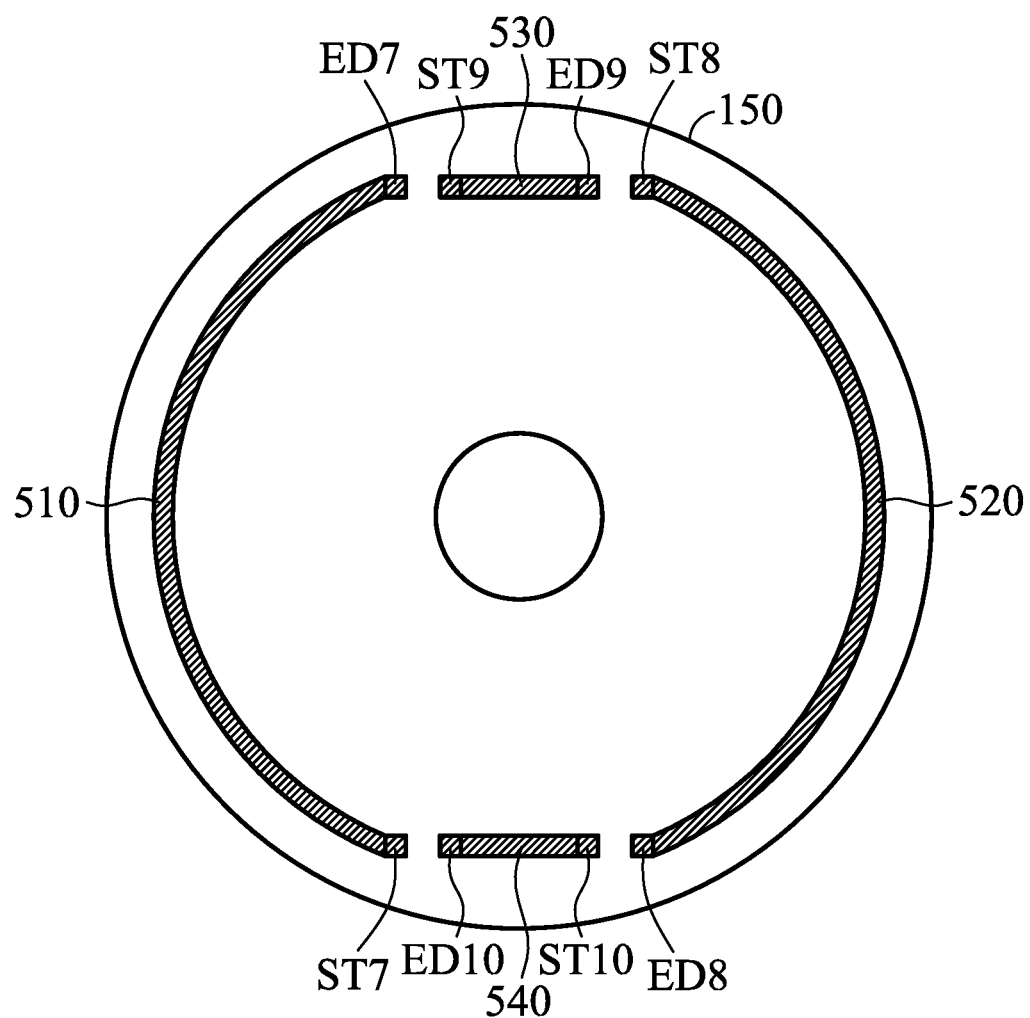
FIG. 5 is a plan view of another exemplary embodiment of the field oxide layer and the conductive line according to various aspects of the present disclosure.

FIG. 5 is a plan view of another exemplary embodiment of the field oxide layer and the conductive line according to various aspects of the present disclosure. In this embodiment, the conductive lines 510, 520, 530 and 540 are formed on the field oxide layer 150. Beginning at a start terminal ST7, the conductive line 510 is extended along a curved-shaped path and finally to an end terminal ED7. Beginning at a start terminal ST8, the conductive line 520 is extended along a curved-shaped path and finally to an end terminal ED8. Beginning at a start terminal ST9, the conductive line 530 is extended along a strip-shaped path and finally to an end terminal ED9. Beginning at a start terminal ST10, the conductive line 540 is extended along a strip-shaped path and finally to an end terminal ED10. In this embodiment, the length of the conductive line 510 is longer than the length of the conductive line 530. Therefore, the resistance of the conductive line 510 is higher than the resistance of the conductive line 530. Additionally, the length of the conductive line 510 is equal to the length of the conductive line 520. Therefore, the resistance of the conductive line 510 is the same as the resistance of the conductive line 520.

Figure 6A:
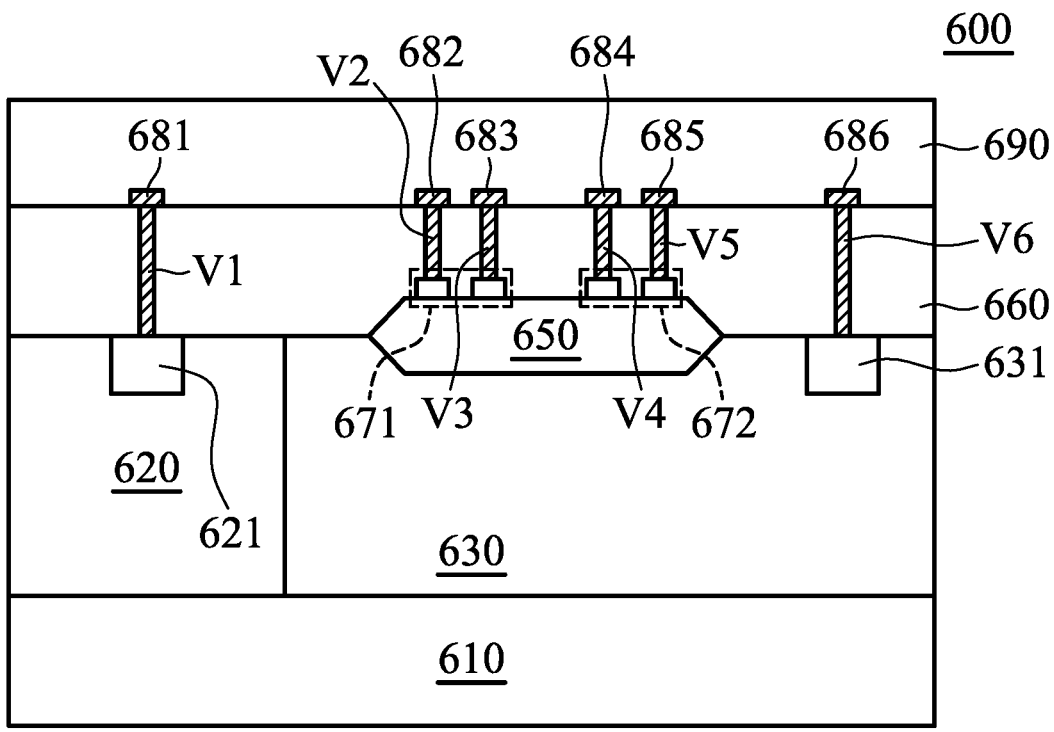
FIG. 6A is a schematic diagram of another exemplary embodiment of the semiconductor structure, according to various aspects of the present disclosure.

FIG. 6A is a schematic diagram of another exemplary embodiment of the semiconductor structure, according to various aspects of the present disclosure. The semiconductor structure 600 comprises a substrate 610, wells 620 and 630, doped regions 621 and 631, a field oxide layer 650, an insulating layer 660 and conductive lines 671 and 672. The substrate 610 has a first conductivity type. In one embodiment, the substrate 610, such as a silicon substrate, a silicon on insulator (SOI) substrate or another suitable semiconductor substrate, is provided.

The well 620 is formed in the substrate 610 and has the first conductivity type. In one embodiment, the dopant concentration of the well 620 is higher than the dopant concentration of the substrate 610. In this embodiment, the well 620 contacts the well 630, but the disclosure is not limited thereto. In other embodiment, the well 620 is spaced apart from the well 630. The well 620 may be formed by ion implantation. For example, when the first conductivity type is P-type, the predetermined region for the well 620 may be implanted with boron ions or indium ions to form the well 620. However, when the first conductivity type is N-type, the predetermined region for the well 620 may be implanted with phosphorous ions or arsenic ions to form the well 620.

The well 660 is formed in the substrate 610 and has a second conductivity type. In this embodiment, the second conductivity type is different from the first conductivity type. For example, when the first conductivity type is P-type, the second conductivity type is N-type. In other embodiments, when the first conductivity type is N-type, the second conductivity type is P-type. In some embodiments, the well 630 is a high-voltage well. The well 630 may be formed by ion implantation. For example, when the second conductivity type is N-type, the predetermined region for the well 630 may be implanted with phosphorous ions or arsenic ions to form the well 630. However, when the second conductivity type is P-type, the predetermined region for the well 630 may be implanted with boron ions or indium ions to form the well 630.

The doped region 621 is formed in the well 620 and has the first conductivity type. In one embodiment, the doped region 621 is formed by ion implantation. In this embodiment, the dopant concentration of the doped region 621 is higher than the dopant concentration of the well 620. In one embodiment, the doped region 621 is used as an anode of a diode.

The doped region 631 is formed in the well 630 and has the second conductivity type. In one embodiment, the doped region 631 is formed by ion implantation. In this embodiment, the dopant concentration of the doped region 631 is higher than the dopant concentration of the well 630. In one embodiment, the doped region 631 is used as a cathode of the diode.

The field oxide layer 650 is disposed on the well 630 and between the doped regions 621 and 631. In this embodiment, the field oxide layer 650 is extended into the well 630. As shown in FIG. 6A, the field oxide layer 650 is spaced apart from the doped region 631, but the disclosure is not limited thereto. In other embodiments, the field oxide layer 650 may be in direct contact with the doped region 631. In some embodiments, the field oxide layer 650 is extended along a ring-shaped path to surround the doped region 631.

The conductive lines 671 and 672 are formed on the field oxide layer 650. As shown in FIG. 6A, the conductive line 671 is spaced apart from the conductive line 672. Since the features of the conductive lines 671 and 672 are the same as the features of the conductive lines 171 and 172, the descriptions of the conductive lines 671 and 672 are omitted. Additionally, the conductive lines shown in FIGS. 2, 3A, 3B, 4A, 4B and 5 can be applied to FIG. 6A.

The insulation layer 660 is formed on the wells 620 and 630, the field oxide layer 650, and the conductive lines 671 and 672. The insulation layer 660 isolates the conductive line 671 from the conductive line 672. The feature of the insulation layer 660 is similar to the feature of the insulation layer 160 of FIG. 1 so the description of the insulation layer 660 is omitted. In this embodiment, the semiconductor structure 600 further comprises tracks 681~686 and an insulation layer 690.

The tracks 681~686 are formed on the insulation layer 660. As shown in FIG. 6A, the track 681 is electrically connected to the doped region 621 via the through-hole V1 to provide as an anode contact of a diode. The track 682 is electrically connected to a start terminal of the conductive line 671 via the through-hole V2 to serve as a first contact terminal of a first passive element. The track 683 is electrically connected to an end terminal of the conductive line 671 via the through-hole V3 to serve as a second contact terminal of the first passive element. The track 684 is electrically connected to a start terminal of the conductive line 672 via the through-hole V4 to serve as a first contact terminal of a second passive element. The track 685 is electrically connected to an end terminal of the conductive line 672 via the through-hole V5 to provide as a second contact terminal of the second passive element. The track 686 is electrically connected to the doped region 631 via the through-hole V6 to serve as a cathode contact of the diode.

Figure 6B:
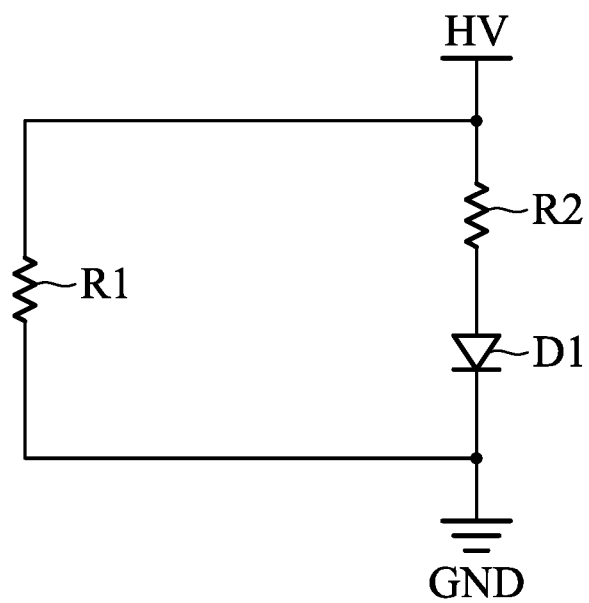
FIG. 6B is an equivalent circuit of the semiconductor structure of FIG. 6A according to an embodiment of the present invention.

The insulation layer 690 is formed on the insulation layer 660. The tracks 681~686 are electrically insulated by the insulation layer 690. Since the feature of the insulation layer 690 is similar to the insulation layer 660, the description of the insulation layer 690 is omitted. FIG. 6B is an equivalent circuit of the semiconductor structure of FIG. 6A according to an embodiment of the present invention. In this embodiment, the conductive line 671 is provided as a resistor R1, and the conductive line 672 is provided as another resistor R2. Additionally, the doped region 621 is provided as an anode of the diode D1, and the doped region 631 is provided as a cathode of the diode D1.

Assume that the track 684 receives a high voltage HV and the track 681 receives a low voltage GND. When the track 682 is electrically connected to the track 681 and the track 683 is electrically connected to the track 684, the resistor R1 is serially connected between the high voltage HV and the low voltage GND. When the track 685 is electrically connected to the track 686, the resistor R2 is connected to the diode D1 in series between the high voltage HV and the low voltage GND.

Figure 7A:
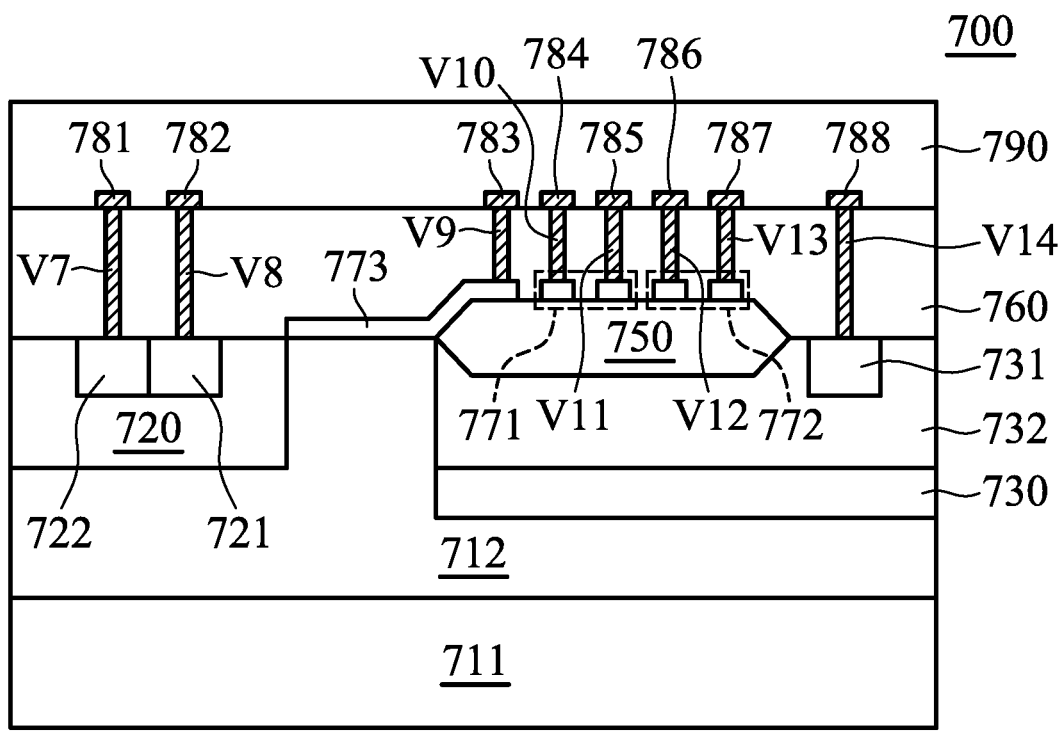
FIG. 7A is a schematic diagram of another exemplary embodiment of a semiconductor structure, according to various aspects of the present disclosure.

FIG. 7A is a schematic diagram of another exemplary embodiment of a semiconductor structure, according to various aspects of the present disclosure. The semiconductor structure 700 comprises a substrate 711, an epitaxial layer 712, wells 720, 730 and 732, doped regions 721, 722 and 731, a field oxide layer 750, a gate 773, and conductive lines 771 and 772. The substrate 711 has a first conductivity type. Since the feature of the substrate 711 is similar to the feature of the substrate 110 shown in FIG. 1, the description of the substrate 711 is omitted. The epitaxial layer 712 is disposed in the substrate 711 and has the first conductivity type. In other embodiments, the epitaxial layer 712 can be omitted.

The wells 720, 730 and 732 are formed in the epitaxial layer 712. In this embodiment, the well 720 is spaced apart from the well 730, and the well 732 is formed in the well 730. In one embodiment, the epitaxial layer 712 may be formed by an epitaxial growth step. Next, wells 720 and 730 are extended into the epitaxial layer 712 sequentially by a doping process (e.g., ion implantation), and a thermal diffusion process. In other embodiments, the well 730 is a deep high-voltage well.

In this embodiment, each of the wells 730 and 732 has the second conductivity type, and the well 720 has the first conductivity type. In some embodiments, each of the wells 720, 730 and 732 is formed by ion implantation. Taking the well 732 as an example, when the second conductivity type is N-type, the predetermined region for the well 732 may be implanted with phosphorous ions or arsenic ions to form the well 732. However, when the second conductivity type is P-type, the predetermined region for the well 732 may be implanted with boron ions or indium ions to form the well 732.

The doped region 731 is formed in the well 732 and has the second conductivity type. The doped regions 721 and 722 are formed in the well 720. The doped region 721 is located between the doped regions 722 and 731. In this embodiment, the doped region 722 has the first conductivity type, and the doped region 721 has the second conductivity type. In one embodiment, each of the doped regions 721, 722 and 731 is formed by ion implantation. Taking the doped region 731 as an example, when the second conductivity type is N-type, the predetermined region for the doped region 731 may be implanted with phosphorous ions or arsenic ions to form the doped region 731. However, when the second conductivity type is P-type, the predetermined region for the doped region 731 may be implanted with boron ions or indium ions to form the doped region 731. In this embodiment, the dopant concentration of each of the doped regions 731 and 721 is higher than the dopant concentration of the well 732, and the dopant concentration of the doped region 722 is higher than the dopant concentration of the well 720.

The field oxide layer 750 is formed on the substrate 711 and located between the doped regions 721 and 731. In this embodiment, the field oxide layer 750 is extended into the well 732. The field oxide layer 750 is spaced apart from the doped region 731, but the disclosure is not limited thereto. In other embodiments, the field oxide layer 750 may be in direct contact with the doped region 731. In some embodiments, the field oxide layer 750 takes the form of a circle or a ring to surround the doped region 731.

The gate 773 is disposed on the substrate 711 and located between the doped region 721 and the field oxide layer 750. The gate 773 partially covers the field oxide layer 750. In this embodiment, the gate 773 and the conductive lines 771 and 772 are formed by the same manufacturing process, and the gate 773 and the conductive lines 771 and 772 are spaced apart from each other. In one embodiment, the materials of the gate 773 and the conductive lines 771 and 772 are the same. In this embodiment, the gate 773 and the doped regions 721 and 731 constitute a transistor. In such cases, the doped region 731 serves as a drain of the transistor, and the doped region 721 serves as a source of the transistor. Additionally, the doped region 722 is capable of serving as a bulk of the transistor.

The conductive lines 771 and 772 are formed on the field oxide layer 750. As shown in FIG. 7A, the conductive lines 771 and 772 are in direct contact with the field oxide layer 750. In this embodiment, the conductive line 771 is spaced apart from the conductive line 772. Since the features of the conductive lines 771 and 772 are similar to the features of the conductive lines 171 and 172, the descriptions of the conductive lines 771 and 772 are omitted. Furthermore, the conductive lines shown in FIGS. 2, 3A, 3B, 4A, 4B and 5 may be formed on the field oxide layer 750.

The insulation layer 760 is formed on the well 720, the doped regions 721 and 722, the gate 773, the field oxide layer 750, the conductive lines 771 and 772, the well 732, and the doped region 731. The insulation layer 760 isolates the gate 773 from the conductive lines 771 and 772, wherein the conductive line 771 is insulated from the conductive line 772. Since the feature of the insulation layer 760 is similar to the insulation layer 160 shown in FIG. 1, the description of the insulation layer 760 is omitted.

In this embodiment, the semiconductor structure 700 further comprises tracks 781~788 and an insulation layer 790. The track 781 is electrically connected to the doped region 722 via the through-hole V7 to serve as a bulk contact. The track 782 is electrically connected to the doped region 721 via the through-hole V8 to serve as a source contact. The track 783 is electrically connected to the gate 733 via the through-hole V9 to serve as a gate contact. The track 784 is electrically connected to one terminal of the conductive line 771 via the through-hole V10 to serve as a first contact terminal of a first passive element. The track 785 is electrically connected to the other terminal of the conductive line 771 via the through-hole V11 to serve as a second contact terminal of the first passive element. The track 786 is electrically connected to one terminal of the conductive line 772 via the through-hole V12 to serve as a first contact terminal of a second passive element. The track 787 is electrically connected to the other terminal of the conductive line 772 via the through-hole V13 to serve as a second contact terminal of the second passive element. The track 788 is electrically connected to the doped region 731 via the through-hole V14 to serve as a drain contact.

Figure 7B:
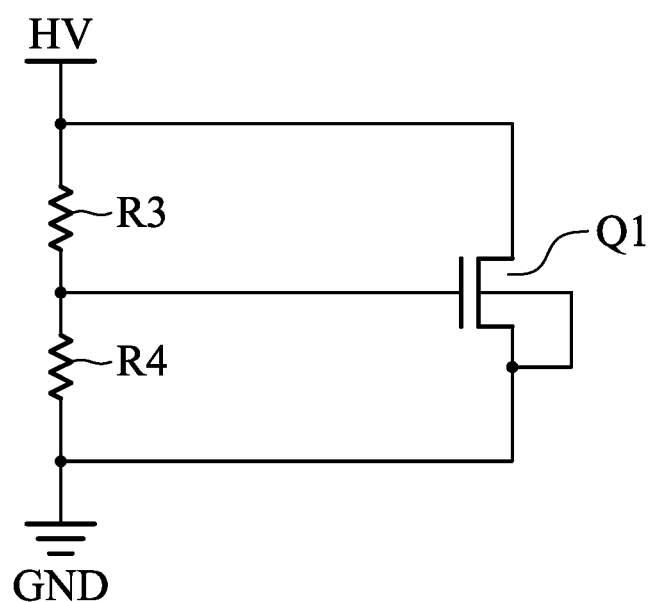
FIG. 7B is an equivalent circuit of the semiconductor structure shown in FIG. 7A according to an embodiment of the present invention.

The insulation layer 790 is formed on the insulation layer 760. The tracks 781~788 are electrically insulated by the insulation layer 790. Since the feature of the insulation layer 790 is similar to the feature of the insulation layer 160 shown in FIG. 1, the description of the insulation layer 790 is omitted. FIG. 7B is an equivalent circuit of the semiconductor structure shown in FIG. 7A according to an embodiment of the present invention. In this embodiment, the doped region 722 serves as a bulk of the transistor Q1, the doped region 721 serves as a source of the transistor Q1, the gate 773 serves as a gate of the transistor Q1, and the doped region 731 serves as a drain of the transistor Q1. In one embodiment, the transistor Q1 is a high-voltage element which is capable of bearing a voltage higher than 700V. Additionally, the conductive line 771 serves as the resistor R4, and the conductive line 772 serves as the resistor R3.

Assume that each of the tracks 781 and 782 receives a low voltage GND and the track 788 receives a high voltage HV. In such cases, when the track 787 is coupled to the track 788 and the track 786 is electrically connected to the track 783, the resistor R3 is coupled between the drain and the gate of the transistor Q1. When the track 784 is coupled to the track 783 and the track 785 is coupled to the track 782, the resistor R4 is coupled between the gate and the source of the transistor Q1.

Figure 8A:
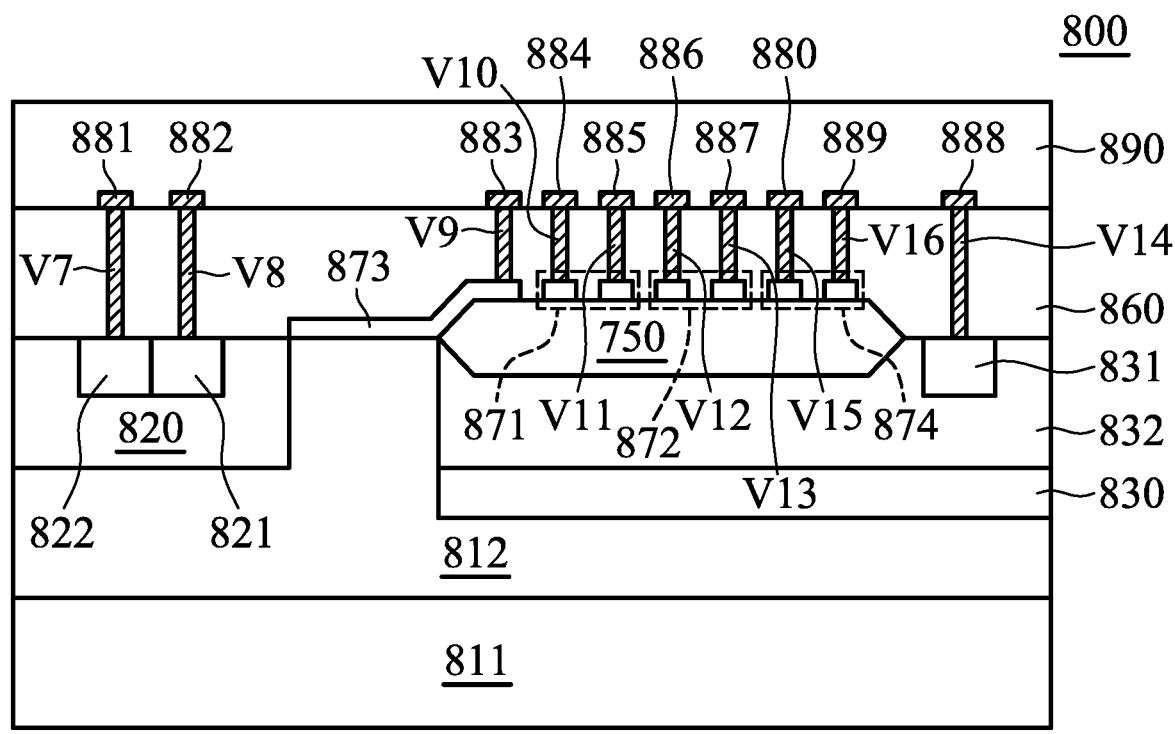
FIG. 8A is a schematic diagram of another exemplary embodiment of the semiconductor structure, according to various aspects of the present disclosure.

FIG. 8A is a schematic diagram of another exemplary embodiment of the semiconductor structure, according to various aspects of the present disclosure. FIG. 8A is similar to FIG. 7A exception that the semiconductor structure 800 of FIG. 8A further comprises a conductive line 874. In this embodiment, three conductive lines are formed on the field oxide layer 850. The number of conductive lines is not limited in the present disclosure. In other embodiments, the semiconductor structure 800 further comprises more conductive lines. As shown in FIG. 8A, one terminal of the conductive line 874 is electrically connected to the track 880 via the through-hole V15. Similarly, the other terminal of the conductive line 874 is electrically connected to the track 889 via the through-hole V16. The lengths or widths of the conductive lines 871, 872 and 874 are controlled to adjust the resistances of the conductive lines 871, 872 and 874. In one embodiment, at least one of the conductive lines 871, 872 and 874 has a low resistance, such as 15MΩ. In such cases, another of the conductive lines 871, 872 and 874 has a high resistance, such as 60MΩ.

Figure 8B:
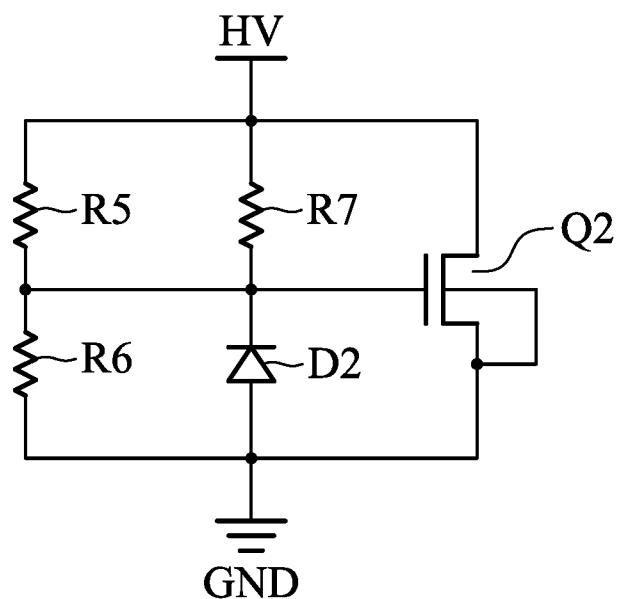
FIG. 8B is an equivalent circuit of the semiconductor structure of FIG. 8A according to an embodiment of the present invention.

FIG. 8B is an equivalent circuit of the semiconductor structure of FIG. 8A according to an embodiment of the present invention. In this embodiment, the conductive line 871 serves as the resistor R5, the conductive line 872 serves as the resistor R6, and the conductive line 873 serves as the resistor R7. Furthermore, the doped region 822 of FIG. 8A serves as a bulk of the transistor Q2, the doped region 821 of FIG. 8A serves as a source of the transistor Q2, the gate 873 of FIG. 8A serves as a gate of the transistor Q2, and the doped region 831 of FIG. 8A serves as a drain of the transistor Q2. In one embodiment, the transistor Q2 is a high-voltage element which bearing the voltage higher than 700V. Assume that each of the tracks 881 and 882 receives a low voltage GND, and the track 888 receives a high voltage HV.

In such cases, when the track 885 receives the high voltage HV and the track 884 is coupled to the track 883, the resistor R5 is coupled between the drain and the gate of the transistor Q2. In one embodiment, the resistance of the resistor R5 is approximately 60MΩ. When the track 886 is coupled to the track 883 and the track 887 receives the low voltage GND, the resistor R6 is coupled between the gate and the source of the transistor Q2. When the track 889 is coupled to the track 888 and the track 880 is coupled to the track 883, the resistor R7 is coupled between the drain and the gate of the transistor Q2. In one embodiment, the resistance of the resistor R7 is about 15MΩ. In one embodiment, the diode D2 is an external element coupled between the tracks 883 and 882. In other embodiments, the diode D2 is integrated into the semiconductor structure 800.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A semiconductor structure comprising:
   a substrate having a first conductivity type;
   a first well formed on the substrate and having a second conductivity type;
   a field oxide layer disposed on the first well;
   a first conductive line formed on the field oxide layer and in direct contact with the field oxide layer; and
   a second conductive line formed on the field oxide layer and in direct contact with the field oxide layer, wherein the first conductive line is spaced apart from the second conductive line,
   wherein the first conductive line is used as one passive element, and the second conductive line is used as another passive element.

2. The semiconductor structure as claimed in claim 1, wherein a length of the first conductive line is different from a length of the second conductive line.

3. The semiconductor structure as claimed in claim 1, wherein a width of the first conductive line is different from a width of the second conductive line.

4. The semiconductor structure as claimed in claim 1, wherein a bottom surface of the first conductive line and a bottom surface of the second conductive line are in direct contact with a top surface of the field oxide layer.

5. The semiconductor structure as claimed in claim 1, wherein the first conductivity type is the same as the second conductivity type, and a dopant concentration of the first well is higher than a dopant concentration of the substrate.

6. The semiconductor structure as claimed in claim 1, further comprising:
a third conductive line formed on the field oxide layer and in direct contact with the field oxide layer, wherein the third conductive line is spaced apart from the first and second conductive lines.

7. The semiconductor structure as claimed in claim 1, further comprising:
a second well formed in the substrate and having the first conductivity type;
a first doped region formed in the first well and having the second conductivity type; and
a second doped region formed in the second well and having the first conductivity type, wherein the field oxide layer insulates the first doped region from the second doped region.

8. The semiconductor structure as claimed in claim 7, wherein the field oxide layer surrounds the first doped region.

9. The semiconductor structure as claimed in claim 7, further comprising:
a third doped region formed in the second well and having the second conductivity type; and
a gate disposed on the substrate and located between the field oxide layer and the third doped region, wherein the gate overlaps a portion of the field oxide layer.

10. The semiconductor structure as claimed in claim 7, wherein the first conductivity type is N-type, and the second conductivity type is P-type.

11. The semiconductor structure as claimed in claim 7, wherein the first conductivity type is P-type, and the second conductivity type is N-type.

12. The semiconductor structure as claimed in claim 7, wherein the first well contacts the second well.

13. The semiconductor structure as claimed in claim 7, wherein the field oxide layer is spaced apart from the first doped region.

14. The semiconductor structure as claimed in claim 1, wherein a material of each of the first and second conductive lines is SiCr, metal or Poly.

15. The semiconductor structure as claimed in claim 1, wherein a resistance of the first conductive line is lower than a resistance of the second conductive line.

16. The semiconductor structure as claimed in claim 1, wherein the first conductive line does not overlap the second conductive line.

17. The semiconductor structure as claimed in claim 1, further comprising:
a first track electrically connected to a first terminal of the first conductive line via a first through-hole;
a second track electrically connected to a second terminal of the first conductive line via a second through-hole;
a third track electrically connected to a first terminal of the second conductive line via a third through-hole;
a fourth track electrically connected to a second terminal of the second conductive line via a fourth through-hole.

18. The semiconductor structure as claimed in claim 17, wherein one of the first track and the second track is directly connected to one of the third track and the fourth track.

19. The semiconductor structure as claimed in claim 1, further comprising:
a first doped region formed in the first well and having the second conductivity type,
wherein the field oxide layer surrounds the first doped region.

* * * * *